(12) United States Patent
Webster et al.

(10) Patent No.: US 7,342,215 B2
(45) Date of Patent: Mar. 11, 2008

(54) DIGITAL CAMERA MODULE PACKAGE FABRICATION METHOD

(75) Inventors: Steven Webster, Miao-li (TW); Ying-Cheng Wu, Fullerton, CA (US); Kun-Hsieh Liu, Miao-li (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 11/453,454

(22) Filed: Jun. 14, 2006

(65) Prior Publication Data

US 2007/0057148 A1    Mar. 15, 2007

(30) Foreign Application Priority Data

Sep. 9, 2005    (CN) .................. 2005 1 0037226

(51) Int. Cl.
*H01L 27/00* (2006.01)
*H01J 5/02* (2006.01)
(52) U.S. Cl. ..................... 250/208.1; 250/239
(58) Field of Classification Search ............ 250/208.1, 250/239; 438/116
See application file for complete search history.

(56) References Cited

U.S. PATENT DOCUMENTS

| | | | | |
|---|---|---|---|---|
| 5,159,432 A | * | 10/1992 | Ohkubo et al. ............. | 257/705 |
| 5,877,546 A | * | 3/1999 | You .......................... | 257/680 |
| 5,950,074 A | * | 9/1999 | Glenn et al. ................ | 438/121 |
| 6,034,429 A | * | 3/2000 | Glenn et al. ................ | 257/701 |
| 6,384,472 B1 | * | 5/2002 | Huang ........................ | 257/680 |
| 6,420,204 B2 | * | 7/2002 | Glenn ........................ | 438/64 |
| 6,630,727 B1 | * | 10/2003 | Tutsch et al. ............... | 257/668 |
| 6,686,588 B1 | * | 2/2004 | Webster et al. ............. | 250/239 |
| 6,759,266 B1 | * | 7/2004 | Hoffman ..................... | 438/64 |
| 7,095,621 B2 | * | 8/2006 | Saimun et al. .............. | 361/772 |
| 2004/0041088 A1 | * | 3/2004 | Chen .......................... | 250/239 |
| 2004/0165356 A1 | * | 8/2004 | Mun et al. .................. | 361/715 |
| 2005/0258518 A1 | * | 11/2005 | Yang et al. ................. | 257/666 |

FOREIGN PATENT DOCUMENTS

CN    03100661.2    8/2004

* cited by examiner

*Primary Examiner*—John R. Lee
(74) *Attorney, Agent, or Firm*—Jeffrey T. Knapp

(57) ABSTRACT

A digital camera module package method includes the steps of: firstly, providing a carrier (30), which includes a base (24) and a leadframe (320). The base has a cavity therein and the leadframe includes a number of conductive pieces (322); Secondly, mounting an image sensor chip (34) on the base and received in the cavity, the image sensor having a photosensitive area. Thirdly, providing a plurality of wires (36), each electrically connecting the image sensor chip and a corresponding one of the conductive pieces of the carrier. Fourthly, applying an adhesive means (3262) around the image sensor chip that at least partially covers all the wires. Finally, mounting a transparent cover (38) on the carrier, where an adhesive means fixes the cover in place.

19 Claims, 7 Drawing Sheets

DIGITAL CAMERA MODULE PACKAGE FABRICATION METHOD

CROSS-REFERENCE TO RELATED APPLICATIONS

This application is related to a co-pending U.S. Patent Application Ser. No. 11/453,456, entitled "IMAGE SENSOR CHIP PACKAGE FABRICATION METHOD", by Steven Webster et al. Such application has the same assignee as the present application and has been concurrently filed herewith. The disclosure of the above identified application is incorporated herein by reference.

TECHNICAL FIELD

The present invention generally relates to an integrated circuit (IC) chip package fabrication method and, more particularly, to a digital camera module fabrication method with an image sensor chip package.

BACKGROUND

With the development of wireless communication technologies, increasing numbers of mobile phones and personal digital assistants (PDAs) now include digital cameras as a special feature. Image sensors are a core element of digital cameras. Therefore, image sensors are widely used in digital camera modules in order to convert the optical image data of an object into electrical signals. In order to protect the image sensor from contamination or pollution (i.e. from dust or water vapor), the image sensor is generally sealed in a structural package.

A typical image sensor chip package method (not labeled) is disclosed in Chinese Publication Number CN1518079 on Aug. 4, 2004, and is illustrated in FIG. 10. The image sensor chip package method includes the following steps: firstly, a plurality of [-shaped conductors 130 are provided. Secondly, plastics are injected to partially enclose the conductors 130, thereby forming a base 146. Some of the conductors 130 are exposed outside of the base 146. Thirdly, a ring-like middle portion 148 is further formed on the base 146 by means of injection. The base 146 and the middle portion 148 cooperatively form a space 150. Fourthly, an image sensor 152 having a plurality of pads 154 is disposed in the space 150. Fifthly, a number of bonding wires 156 are provided to connect the pads 154 and the conductors 130. Finally, a cover 158 is secured to the top of the middle portion 148 via an adhesive glue, thereby hermetically sealing the space 150 and allowing light beams to pass therethrough.

In the process of connecting the wires 156, each wire 156 needs to be connected with the conductor 130. Furthermore, a larger space is needed in order to conveniently operate. It is obvious that this method of connecting wires 156 is complex and as a result it is also expensive. In addition, the relative large volume of the image sensor chip package results in more dust-particles adhering to the cover 158, the bottom board and the sidewalls of the base 146. Thus, more dust-particles will drop onto the chip 152. The dust-particles obscure the optical path and produce errors in the image sensing process. Accordingly, the quality and/or reliability of the image sensor chip package 100 can be affected. Moreover, the bonding wires 156, exposed in the space 150, lack protection and may thus easily be damaged by dust-particles entering the space 150.

Therefore, a new digital camera module fabrication method is desired in order to overcome the above-described shortcomings.

SUMMARY OF THE INVENTION

One embodiment of a digital camera module package method includes the steps of:

providing a carrier including a base and a leadframe, the base having a cavity therein, the leadframe comprising a plurality of conductive pieces, the conductive pieces of the leadframe being embedded in the base and spaced from each other;

mounting an image sensor chip in the cavity, the image sensor having a photosensitive area;

providing a plurality of wires, each electrically connecting the image sensor chip and a corresponding one of the conductive pieces of the carrier;

applying an adhesive means around the image sensor chip and at least partially covering all the wires;

mounting a transparent cover to the carrier, the adhesive means adhering to the cover and configured in a manner so as to define a sealing space for a photosensitive area of the image sensor chip therein, and the base and the cover allowing one end of the conductive pieces to be exposed out therefrom; and mounting a lens module on the cover.

Other advantages and novel features will become more apparent from the following detailed description when taken in conjunction with the accompanying drawings.

BRIEF DESCRIPTION OF THE DRAWINGS

Many aspects of the present digital camera module package can be better understood with reference to the following drawings. The components in the drawings are not necessarily drawn to scale, the emphasis instead being placed upon clearly illustrating the principles of the image sensor chip package. Moreover, in the drawings, like reference numerals designate corresponding parts throughout the several views.

DETAILED DESCRIPTION OF THE PREFERRED EMBODIMENTS

Figure 1:
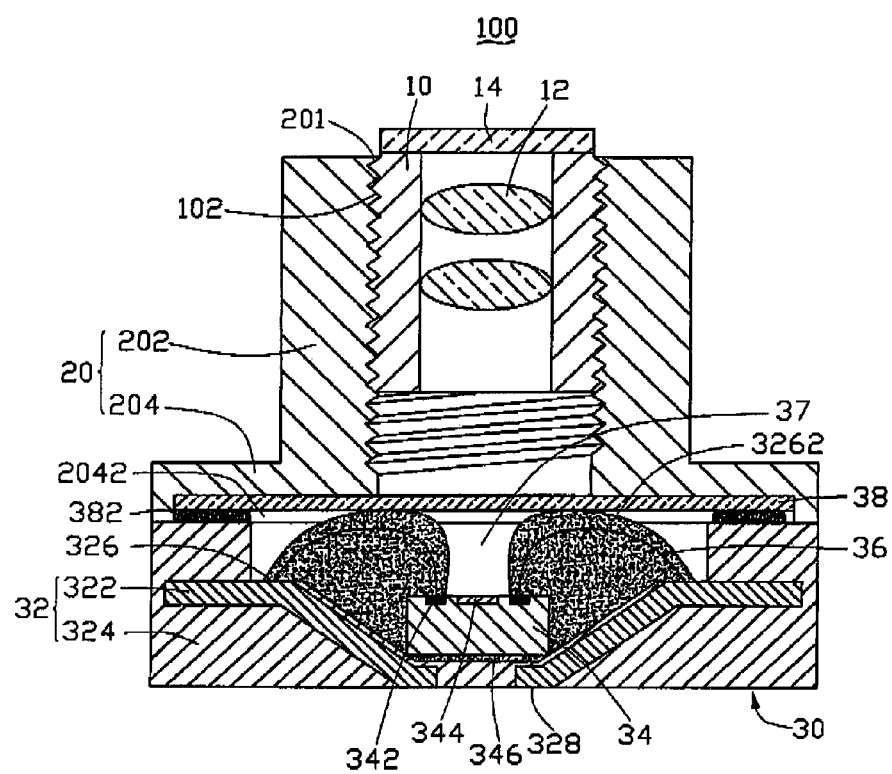
FIG. 1 is a schematic, cross-sectional view of a digital camera module with an image sensor chip package according to a preferred embodiment.

Referring to FIG. 1, a digital camera module includes a barrel 10, a seat 20 and an image sensor chip package 30 in accordance with a preferred embodiment. The image sensor chip package 30 includes a carrier 32, a chip 34, a number of bonding wires 36 and a cover 38.

The barrel 10 is substantially a hollow cylinder with two open ends so that light can be transmitted therethrough. Several lens elements 12 are disposed in the barrel 10, and receive incoming light that enters from the outside. The barrel 10 has an outer thread 102 defined in an outer periphery wall thereof. A glass board 14 is disposed in front of the lens elements 12 and covers one end of the barrel 10. As such, the glass board 14 protects the lens elements 12 from being scraped or otherwise abraded and keeps dust from entering the system.

The seat 20 includes a seat body 202 and a flange 204 formed together. The seat body 202 is a hollow cylinder. The flange 204 is formed at a bottom end of the seat body 202. The flange 204 has a rectangular cavity 2042 defined in a middle thereof opposite to the seat body 202. The rectangular cavity 2042 communicates with the seat body 202 so that light can be transmitted therethrough. An outer diameter of the seat body 202 is smaller than an edge of the flange 204 so that a step is formed at a connection between them. An inner periphery wall of the seat body 202 defines an inner thread 201 for engaging with the outer thread 102 of the barrel 10.

The carrier 32 of the image sensor chip package 30 includes a number of conductive pieces 322 and a plastic base 324. The conductive pieces 322 are spaced from each other and aligned in parallel, and cooperatively form the carrier 32 when combined with the plastic base 324.

The image sensor chip 34 is received in the carrier 32, and is adhered to the bottom of the carrier 32 with an adhesive glue 346. A top surface of the image sensor chip 34 is arranged with a photosensitive area 344 and a number of chip pads 342 around the photosensitive area 344.

The bonding wires 36 can be made of a conductive material such as, for example, gold or aluminum alloy. One end of each wire 36 is connected/joined with a respective chip pad 342 of the image sensor chip 34, and the other end of the wire 36 is connected/joined with a respective upper pad 326 forming by the conductive pieces 322.

The cover 38 is transparent and is laid over the image sensor chip 34 which receives light transmitted through the cover 38. An edge portion of the cover 38 is adhered to the base 324 by a bonding glue 382 and therefore seals the image sensor chip 34 in the cavity of the base 324.

An adhesive glue 3262, such as a silicone, epoxy, acrylic, or palyarnide adhesive, is applied round the photosensitive area 344 of the image sensor chip 34. The adhesive glue 3262 surrounds all of the bonding wires 36 and covers the upper pads 326, and the inner surface of the carrier 32. The adhesive glue 3262 also adheres to a middle circumferential area of the cover 38 and defines a small sealing space 37 configured to seal the photosensitive area 344 therein. The bonding wires 36 and the adhesive glue 3262 are received in the carrier 32. It can be seen that the photosensitive area 344 of the image sensor chip 34 is sufficiently protected from outside pollution due to the small volume of the sealing space 37. The bonding wires 36 are protected by the adhesive glue 3262, and the conductive pieces 322 are protected by the base 324.

Figure 2:
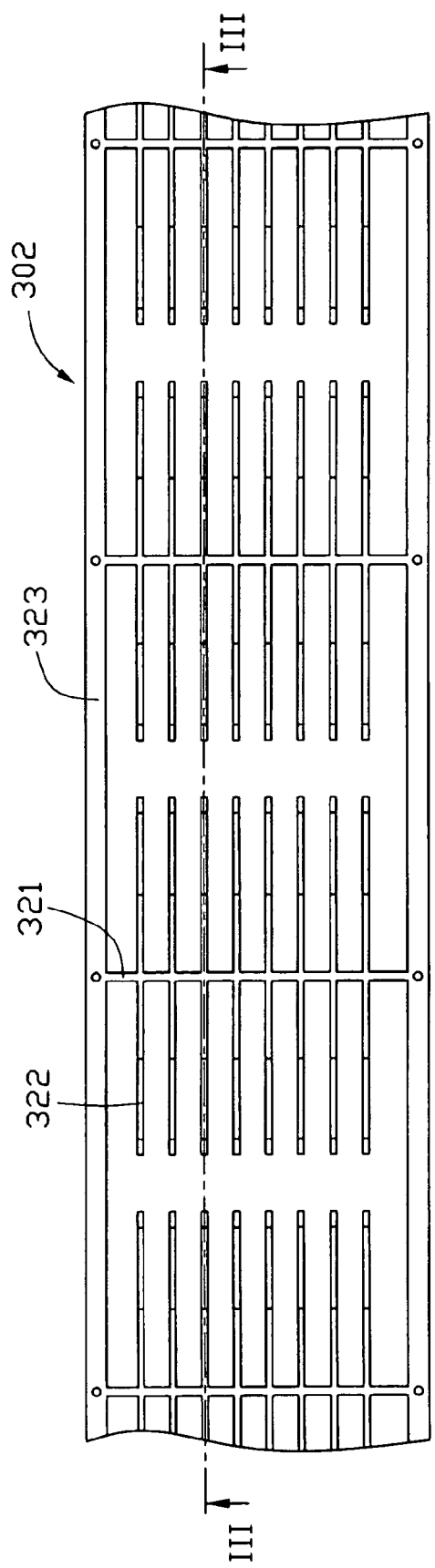
FIG. 2 is a schematic, top-down plan view of the leadframe of FIG. 1.
Figure 3:
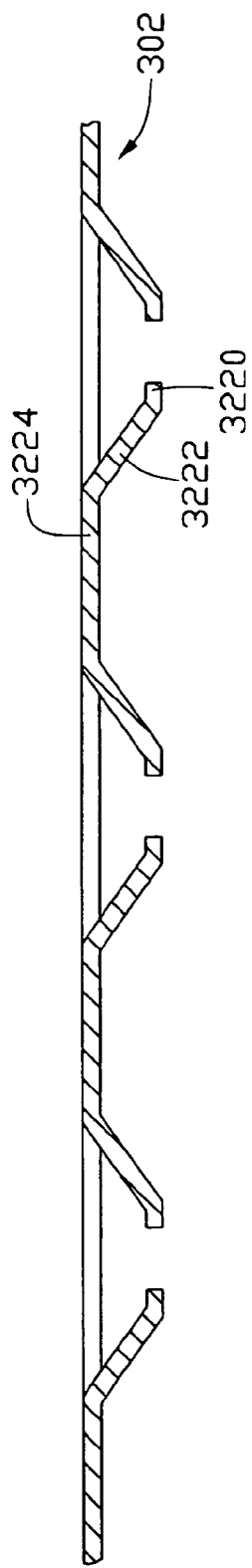
FIG. 3 is a cross-sectional view of the leadframe in FIG. 2 along a line III-III.
Figure 4:
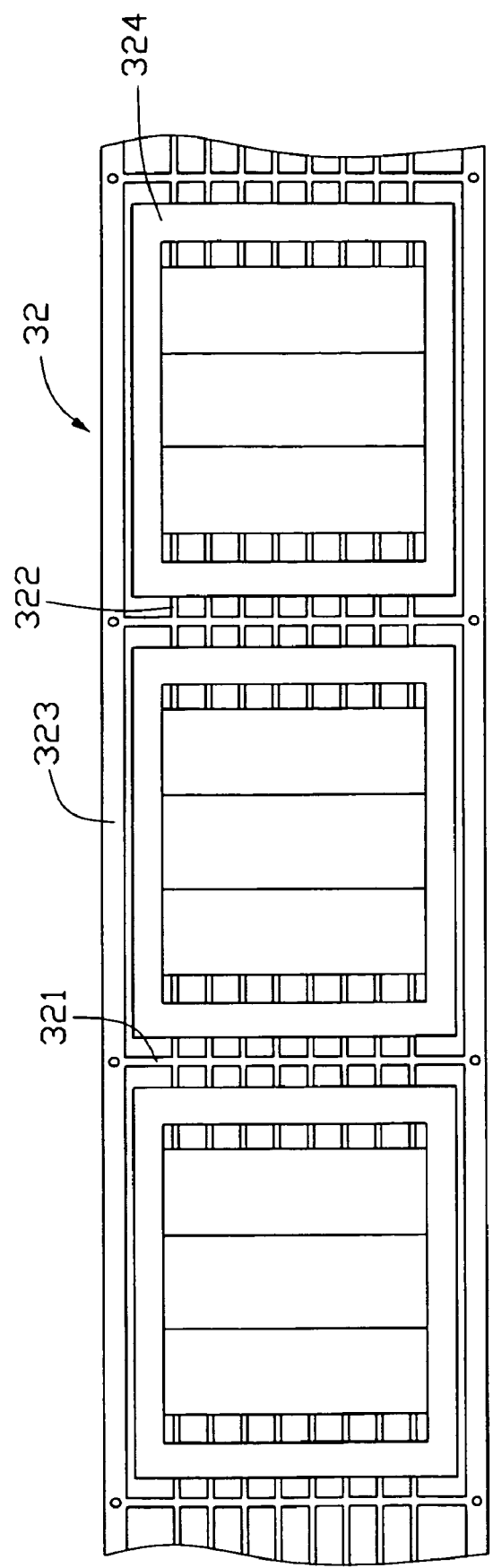
FIG. 4 is a schematic, top view of the carrier formed by insert-molding shown in FIG. 4.

A method of fabricating the digital camera module 100 is disclosed by way of example. In one embodiment, a plurality of image sensor packages 30 are fabricated simultaneously to minimize the cost associated with each individual image sensor package 30. Referring to FIGS. 2 and 3, firstly, a conductor element 302 is provided. The conductor element 320 is formed on a metal plate by etching. The conductor element 321 includes a support beam 321, many groups of conductive pieces 322 and a number of separate beams 323. The conductive pieces 322 are punched so that each of the conductive pieces 322 forms a first terminal portion 3220, a second connecting portion 3222 and a third terminal portion 3224, where the second connecting portion 3222 interconnects the first and third terminal portions 3220, 3224. The first and third portions 3220, 3224 are spaced apart and aligned in parallel to each other. The second portion 3222 is slanted relative to the first and third portions 3220, 3224. Correspondingly, the conductive pieces 322 are divided into two groups. The two groups are symmetrically arranged and the conductive pieces in the same group are parallel to and spaced from each other, thereby forming a plurality of leadframes 320 connected to each other.

Secondly, the molten plastic is injected into the conductor element 302 by insert-molding. The plastic is solidified to form the plastic base 324. The plastic base 324 partially encloses the upper and lower surfaces of each of the leadframes 320. One end of each of the first portions 3220 is exposed, thus forming a plurality of upper pads 326. A distal end of each of the third portions 3224 is exposed, thus forming a number of lower pads 328. The plastic base 324 and each leadframe 130 cooperatively form carriers connected to each other. Each carrier 32 is formed with a trapezoidal cavity.

Figure 5:
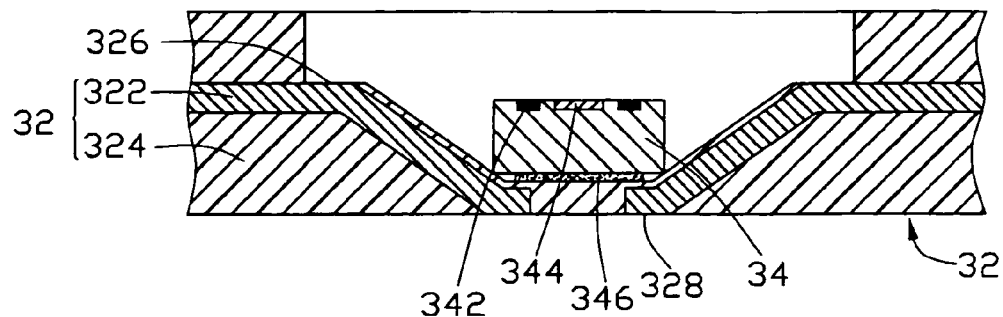
FIG. 5 is a cross-sectional view after the image sensor is put into the carrier.

Thirdly, referring to FIG. 5, each image sensor chip 34 is received in a corresponding trapezoidal cavity, and is adhered to the bottom of the carrier 32 via an adhesive glue 346. Alternatively, the adhesive glue 346 can be replaced by any other appropriate adhesive means such as, for example, by metallurgical means.

Figure 6:
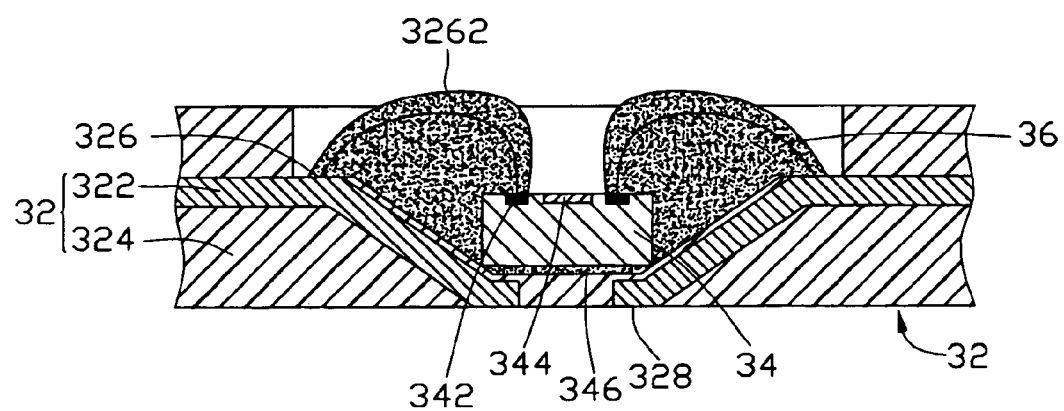
FIG. 6 is a cross-sectional view showing the adhesive glue surrounding all of the bonding wires.

Fourthly, referring to FIG. 6, one end of each wire 36 is connected/joined with a respective chip pad 342 of the image sensor chip 34, and the other end of the wire 36 is connected/joined with a respective upper pad 326 forming by the first portions 3220 of the leadframe 320.

Figure 7:
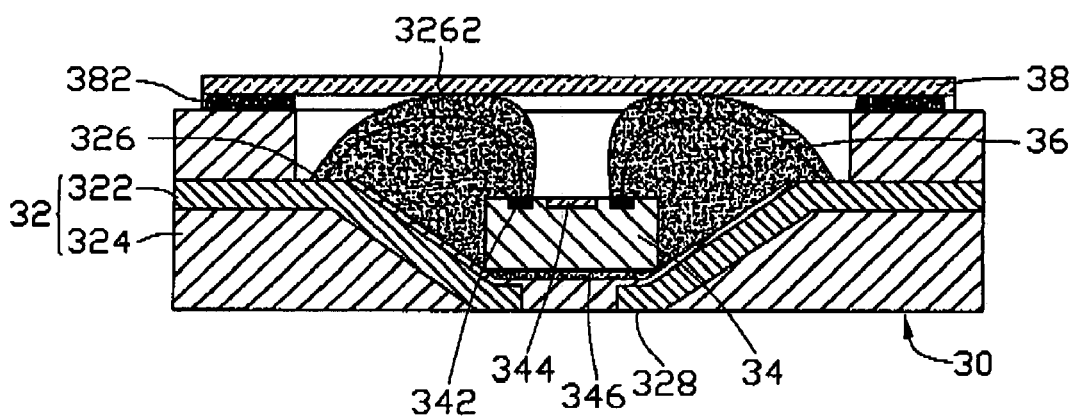
FIG. 7 is a cross-sectional view showing the adhesive glue fixing the cover and defining a small sealing space to seal the photosensitive area.
Figure 8:
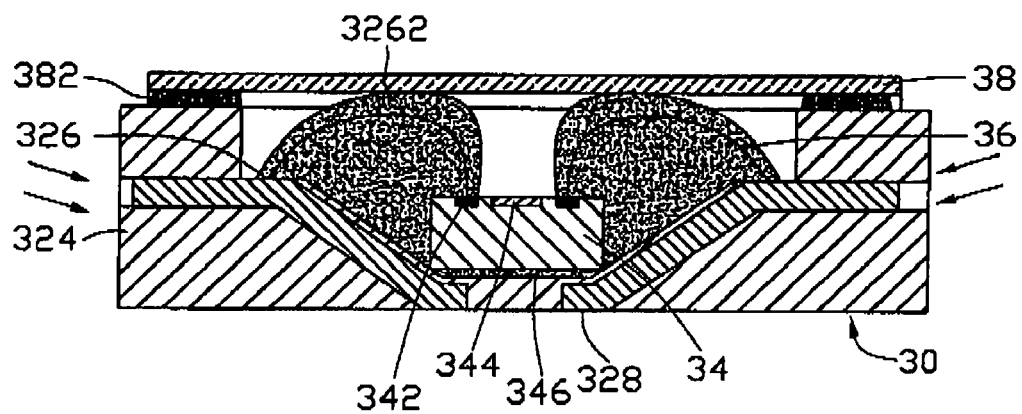
FIG. 8 is a cross-sectional view showing therim of the image sensor package.

Fifthly, referring to FIGS. 7 and 8, each cover 38 is laid over the image sensor chip 34 which receives light transmitted through the cover 38. An edge portion of the cover 38 is adhered on the base 324 by a bonding glue 382 and therefore seals the image sensor chip 34 in the cavity of the base 324. The adhesive glue 3262 surrounds all of the bonding wires 36 and covers the first portions 3220, and the inner surface of the carrier 32. The adhesive glue 3262 also adheres to a middle circumferential area of the cover 38 and defines a small sealing space 37 configured to seal the photosensitive area 344 therein, The bonding wires 36 and the adhesive glue 3262 are received in the carrier 32. It can be seen that the photosensitive area 344 of the image sensor chip 34 is protected from outside pollution due to the small volume of the sealing space 37. The bonding wires 36 are protected by the adhesive glue 3262, and the leadframe 320 is protected by the base 324.

After that, the conductor element 302 with the plastic base are cut along the rim of each carrier 30 so as to separate a plurality of carriers 30. At that time, distal ends of each of the conductive pieces 322 are exposed outside. Usually, the conductive pieces 322 are shortened owing to a different shrinkage after the carriers are cut. A kind of fuse technology such as ultrasonic fuse, laser fuse or heat fuse may be used to irradiate the rim of the carrier. Accordingly, the plastic base 324 are melted so as to enclose the conductive pieces 322. By forming a plurality of image sensor packages 30 simultaneously, several advantages are realized. One advantage is that it is less labor intensive to handle and process a plurality of image sensor packages simultaneously rather than to handle and process each image sensor package on an individual base. By reducing labor, the cost associated with each package is minimized.

Figure 9:
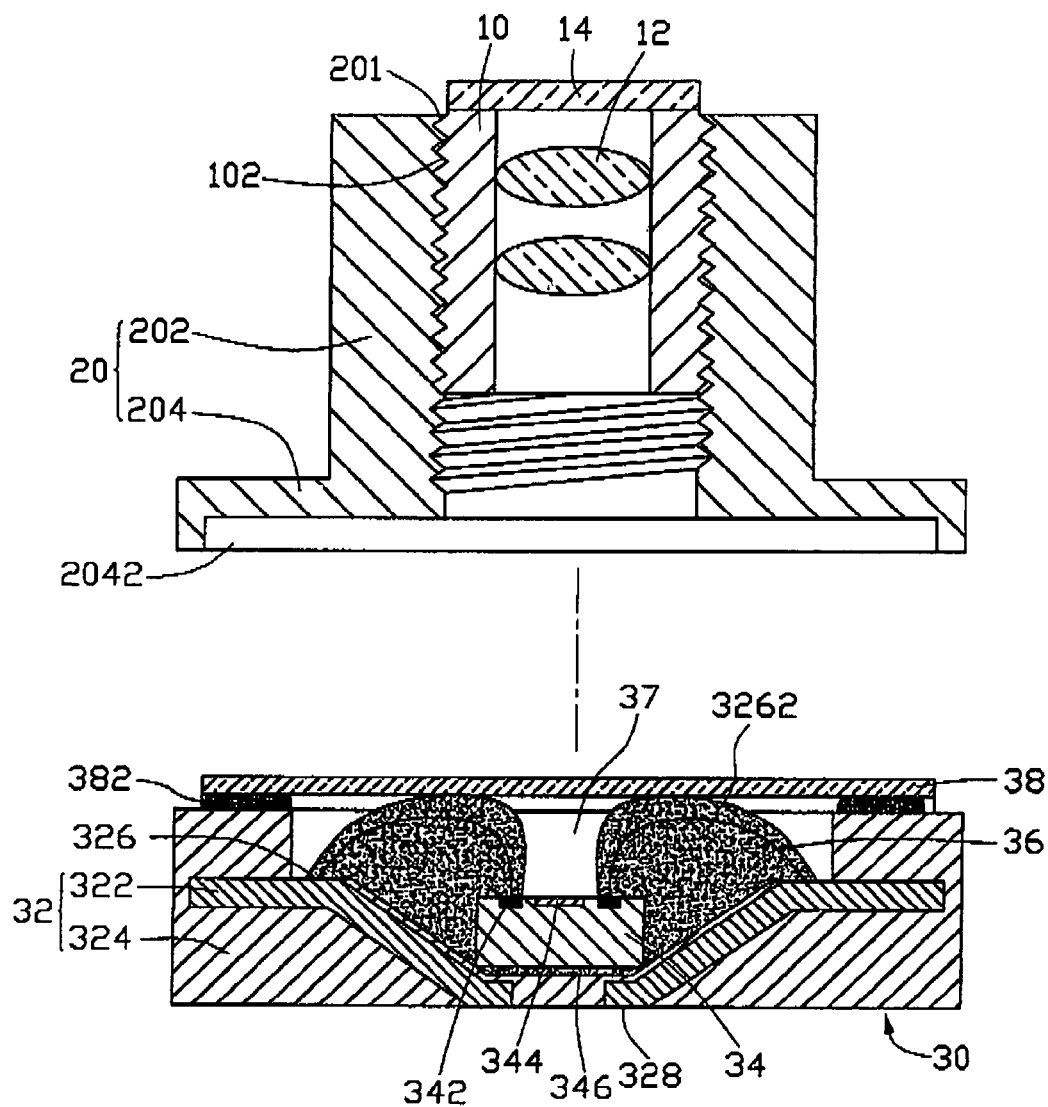
FIG. 9 is a cross-sectional view showing the barrel and the seat mounted on the image sensor package.
Figure 10:
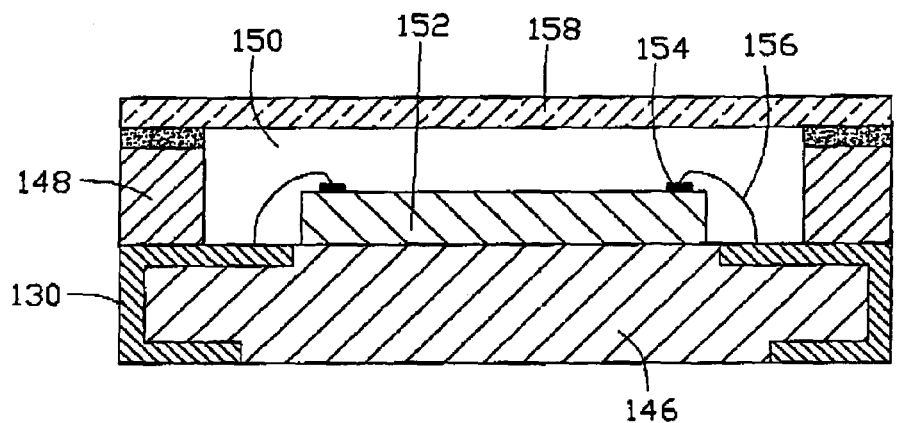
FIG. 10 is a schematic, cross-sectional view of a typical image sensor chip package.

Finally, referring to FIG. 9, several lens elements 12 are received in the barrel 10. The outer thread 102 of the barrel 10 engages with the inner thread 201 of the seat 20, whereby the barrel 10 and the seat 20 are connected with each other. The seat 20 is then mounted on the image sensor chip package 30 by welding/glue, with the image sensor 34 aligning with the lens elements 12. At the same time, the cover 38 is received in the rectangular cavity 2042. The assembly process of the digital camera module 100 is thus completed.

In an alternative embodiment, the arrangement of the conductive pieces of the leadframe 320 can be changed so long as the conductive pieces 322 are spaced from each other. The second portion 3222 can be perpendicular to the first and third portions 3220, 3224 rather than being slanted. The base 324 can be of another shape such as cylinder-shaped, or column-shaped with a pentagonal or hexagonal cross-section. Understandably, the image sensor package may also be produced in single units.

In the above embodiments, the adhesive glue 3262 may only be disposed around the photosensitive area 344 so as to define a sealing space for protecting the photosensitive area 344. One main advantage of the digital camera module with this image sensor chip package is its reliability and high image quality.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A digital camera module package method, comprising the steps of:
   providing a carrier comprising a base and a leadframe, the base having a cavity therein, the leadframe comprising a plurality of conductive pieces, the conductive pieces of the leadframe being embedded in the base and spaced from each other;
   mounting an image sensor chip in the cavity, the image sensor having a photosensitive area;
   providing a plurality of wires, each respectively electrically connecting the image sensor chip with a corresponding one end of the conductive pieces of the carrier;
   applying an adhesive means around the photosensitive area of the image sensor chip and at least partially covering all the wires;
   mounting a transparent cover to the carrier, the adhesive means adhering to the cover and configured in a manner so as to define a sealing space for enclosing the photosensitive area of the image sensor chip therein, and the base allowing another end of the conductive pieces to be exposed out therefrom; and
   mounting a lens module on the cover.

2. The method as claimed in claim 1,
   wherein the each of the conductive pieces of the leadframe comprises a first portion, a second portion and a third portion, the first and second portions are parallel to and spaced from each other, the second portion is slanted relative to the first and third portions.

3. The method as claimed in claim 1, wherein the carrier is formed so as to allow it to enclose the leadframe in the base, and the cavity is trapezoidal in shape.

4. The method as claimed in claim 1, wherein the cover is adhered to the carrier by another adhesive means.

5. A method of fabricating a digital camera module, comprising the steps of:
   providing a conductor element comprising a plurality of leadframes, each leadframe made up of a plurality of conductive pieces;
   injecting plastics to partially enclose the conductor element to form a plurality of carriers connected to each other, each carrier having a plurality of pads formed by the conductive pieces outside the carrier;
   mounting image sensor chips in the carriers, each image sensor chip having a photosensitive area and a plurality of chip pads around the photosensitive area;
   providing a plurality of wires each respectively electrically connecting a corresponding one of the chip pads of the image sensor chip and the conductive pieces;
   applying an adhesive means on a peripheral edge of the image sensor chip around the photosensitive area of the image sensor chip; and
   mounting a transparent cover to each carrier, the adhesive means adhering to the cover, thereby defining a sealing space for sealing the photosensitive area of the image sensor chip therein;
   separating the carriers to form single carrier units; and
   mounting a lens module on the cover.

6. The method as claimed in claim 5, wherein the adhesive means surrounds the wires.

7. The method as claimed in claim 6, wherein the base of the crier has a cavity therein, and the conductive means comprises a plurality of conductive pieces embedded in the base and spaced from each other.

8. The method as claimed in claim 7, wherein the conductor element is manufactured by punching or etching on a metal sheet, and the base is made of plastic materials.

9. The method as claimed in claim 8, wherein the carrier is manufactured by insert-molding.

10. The method as claimed in claim 8, wherein each of the conductive pieces of the conductive means comprises a first portion, a second portion and a third portion, the first and third portions are parallel to and spaced from each other, and the second portion is slanted relative to the first and third portions.

11. The method as claimed in claim 6, wherein the lens module includes a seat and a barrel, the seat includes a seat body and a flange, the flange is mounted on the cover, and the seat body is connected with the barrel.

12. The method as claimed in claim 11, wherein the barrel is connected with the seat by thread.

13. The method as claimed in claim 12, wherein the barrel includes a glass board, and the glass board is disposed on one end of the barrel.

14. A digital camera module package method, comprising the steps of:
   providing a carrier;
   mounting an image sensor chip in the carrier, the image sensor having a photosensitive area;
   providing a plurality of wires, each respectively electrically connecting the image sensor chip with the carrier;
   applying an adhesive means round the photosensitive area of the image sensor chip and at least partially covering a portion of each of all the wires; and
   mounting a transparent cover on the carrier, the adhesive means adhering to a middle circumferential area of the cover and being configured in a manner so as to define a sealing space for enclosing the photosensitive area of the image sensor chip therein.

15. The method as claimed in claim 14, wherein the carrier includes a base, and the base of the carrier has a trapezoidal cavity therein, and a peripheral portion of the transparent cover is mounted on a top surface of the base.

16. The method as claimed in claim 14, wherein the adhesive means is applied to cover a peripheral portion of the image sensor chip and all of each of the wires.

17. The method as claimed in claim 14, wherein the image sensor has a plurality of chip pads, the carrier has a plurality of upper pads formed therein, the adhesive means covers chip pads of the image sensor and upper pads.

18. The method as claimed in claim 1, wherein the adhesive means adheres to a middle portion of the cover.

19. The method as claimed in claim 5, wherein the adhesive means adheres to a middle portion of the cover.

* * * * *